United States Patent
Mathew et al.

(10) Patent No.: US 7,109,550 B2
(45) Date of Patent: Sep. 19, 2006

(54) SEMICONDUCTOR FABRICATION PROCESS WITH ASYMMETRICAL CONDUCTIVE SPACERS

(75) Inventors: Leo Mathew, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 67 days.

(21) Appl. No.: 11/036,860

(22) Filed: Jan. 13, 2005

(65) Prior Publication Data
US 2005/0124130 A1    Jun. 9, 2005

Related U.S. Application Data

(62) Division of application No. 10/427,141, filed on Apr. 30, 2003, now Pat. No. 6,967,143.

(51) Int. Cl.
*H01L 29/792* (2006.01)
(52) U.S. Cl. ............... 257/326; 257/319; 257/401; 257/407; 257/E21.626
(58) Field of Classification Search ............... 257/326
See application file for complete search history.

(56) References Cited

U.S. PATENT DOCUMENTS

| | | | |
|---|---|---|---|
| 5,284,784 A * | 2/1994 | Manley | 438/263 |
| 5,324,960 A * | 6/1994 | Pfiester et al. | 257/67 |
| 5,631,482 A * | 5/1997 | Hong | 257/326 |
| 6,531,350 B1 | 3/2003 | Satoh et al. | |
| 6,563,151 B1 * | 5/2003 | Shin et al. | 257/288 |
| 6,689,650 B1 | 2/2004 | Gambino et al. | |
| 6,768,158 B1 | 7/2004 | Lee et al. | |
| 6,846,734 B1 | 1/2005 | Amos et al. | |
| 7,005,710 B1 * | 2/2006 | Gonzalez et al. | 257/366 |
| 2005/0280103 A1 * | 12/2005 | Langdo et al. | 257/401 |

\* cited by examiner

*Primary Examiner*—Jerome Jackson
*Assistant Examiner*—José R. Diaz

(57) ABSTRACT

A semiconductor process and resulting transistor includes forming conductive extension spacers (146, 150) on either side of a gate electrode (116). Conductive extensions (146, 150) and gate electrode 116 are independently doped such that each of the structures may be n-type or p-type. Source/drain regions (156) are implanted laterally disposed on either side of the spacers (146, 150). Spacers (146, 150) may be independently doped by using a first angled implant (132) to dope first extension spacer (146) and a second angled implant (140) to dope second spacer (150). In one embodiment, the use of differently doped extension spacers (146, 150) eliminates the need for threshold adjustment channel implants.

18 Claims, 3 Drawing Sheets

SEMICONDUCTOR FABRICATION PROCESS WITH ASYMMETRICAL CONDUCTIVE SPACERS

Under 35 USC § 120, this divisional application claims the benefit of non-provisional application Ser. No. 10/427,141, filed Apr. 30, 2003 U.S. Pat. No. 6,967,143.

BACKGROUND OF THE INVENTION

1. Field of the Invention

The present invention relates generally to the field of semiconductor fabrication and, more particularly, to a process of forming small transistors with low leakage and acceptable threshold voltages.

2. Description of Related Art

In the field of semiconductor devices, transistors must simultaneously exhibit high performance and low power characteristics. These two parameters typically compete with one another. As transistor channel lengths decrease, for example, to improve the speed of a device, other parameters such as the subthreshold leakage and the threshold voltage can become more difficult to control. Conventionally, doped transistor channels are employed to control threshold voltages within a desired range. These doped channels are frequently achieved using ion implantation.

Recently, silicon on insulator (SOI) technology has been used to achieve lower power consumption. In addition, gate lengths are being scaled down with each new process technology. The shallow channels needed for SOI and deep sub-micron devices are difficult to achieve consistently with conventional channel doping implants. Without these doped channels, however, it is difficult to fabricate deep submicron devices that exhibit sufficiently low leakage current, adequate threshold voltages, and acceptably low threshold voltage variation. It would be desirable, therefore, to implement a process and resulting transistor having a short channel length, adequate threshold voltage, and low subthreshold leakage without significantly increasing the cost or complexity of the process.

SUMMARY OF THE INVENTION

The problem highlighted above is addressed by a semiconductor process and resulting transistor that includes forming conductive extensions on either side of a gate electrode. The conductive extensions and gate electrode are independently doped such that each of the structures may be n-type, p-type, or intrinsic. Source/drain regions are implanted laterally disposed on either side of the extensions. Extensions may be independently doped by using a first angled implant to dope first extension and a second angled implant to dope second extension. In one embodiment, the use of differently doped extensions eliminates the need for threshold adjustment channel implants such that the channel region of the transistor is substantially free of implanted species.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Reference will now be made in detail to the presently preferred embodiments of the invention, examples of which are illustrated in the accompanying drawings. It should be noted that the drawings are in simplified form and are not to precise scale. Although the invention herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

Generally speaking, the present invention contemplates the formation of a transistor that employs electrically conductive, spacer structures (referred to herein as extensions) on the sidewalls of the transistor gate electrode. Together with the conventional gate electrode structure, the conductive spacers form a three-part transistor gate. The polarity of each of the three gate structures is individually controllable such that the transistor may have, for example, two structures of one polarity and one structure of another. The ability to provide, in this manner, asymmetrically doped extensions, beneficially improves the ability to control the threshold voltage, subthreshold leakage and channel length of very short channel transistors.

Figure 1:
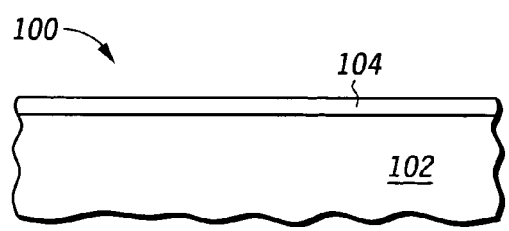
FIG. 1 is a partial cross-sectional view of a semiconductor wafer in which a gate dielectric is formed over a semiconductor substrate.

Referring now to FIG. 1, a gate dielectric film 104 is formed over a semiconductor substrate 102 of a semiconductor wafer 100. In one embodiment, gate dielectric 104 is a silicon dioxide film formed by the thermal oxidation of the upper surface of semiconductor substrate 102. Thermal oxidation of substrate 102 is achieved by exposing the wafer to an oxidizing ambient (e.g., $O_2$, $H_2O$) at a temperature in excess of 900° C. as will be well known to those in the field of semiconductor fabrication processes. In this embodiment, gate dielectric 102 has a thickness of anywhere from 15 to 150 angstroms. In other embodiments, gate dielectric 104 is a "high K" dielectric having a dielectric constant greater than 4.0. High K dielectrics are desirable for use in gate dielectric films to achieve sufficient capacitance with a thicker film. Materials suitable for use in a high K embodiment of dielectric 104 include various metal-oxide compounds such as hafnium-oxide as well as other materials including aluminum oxide, hafnium silicate, zirconium silicate, hafnium aluminate, lanthanum aluminate, zirconium aluminate, and lanthanum oxide. Additional information regarding high K dielectrics is found in, for example, Samavedam, Transistor having a high K dielectric and short gate length and method therefor, U.S. Pat. No. 6,514,808.

An upper portion of semiconductor substrate 102 typically includes a monocrystalline semiconductor material such as silicon on which gate dielectric 104 is formed. In one embodiment particularly suitable for use with low power applications such as mobile and wireless devices, semiconductor substrate 102 is a silicon-on-insulator (SOI) substrate in which the monocrystalline silicon is a relatively thin film (i.e., less than 10,000 angstroms) formed over a buried oxide with a thickness roughly in the range of 1000 to 20,000 angstroms.

Figure 2:
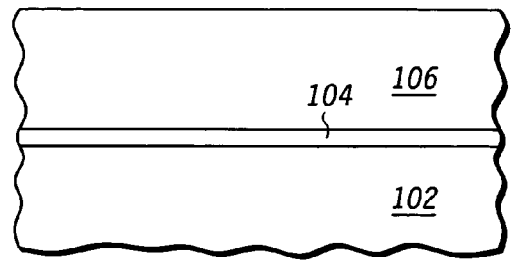
FIG. 2 illustrates processing subsequent to FIG. 1 in which a gate electrode film is formed over the gate dielectric.

Referring now to FIG. 2, a gate electrode film 106 is formed over gate dielectric 104. In one embodiment, gate electrode film 106 is a polysilicon filmed formed by thermally decomposing silane in a reactor chamber maintained at a temperature in the range of approximately 550–650° C. The polysilicon film is likely deposited as undoped silicon and subsequently doped with an n-type (e.g., phosphorous, arsenic) or p-type (e.g., boron) dopant using ion implantation. In other embodiments, the polysilicon may be doped in-situ or by diffusion. In still other embodiments, gate electrode film may comprise a material or compound including, in addition to or in lieu of polysilicon, germanium, tantalum silicon nitride, titanium nitride, molybdenum nitride or a combination thereof.

Figure 3:
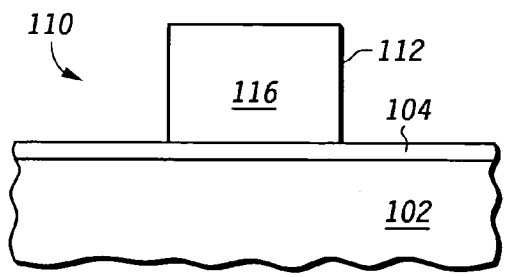
FIG. 3 illustrates processing subsequent to FIG. 2 in which the gate electrode film is patterned to form a gate electrode structure.

Referring now to FIG. 3, gate electrode film 106 is patterned to form a gate electrode 116 having substantially vertical sidewalls 112. Patterning of gate electrode 116 is achieved using photolithography processing and anisotropic or dry etch techniques that are well known in the field. The photolithography processing may include the use of an anti-reflective coating (ARC) and photoresist patterning techniques.

Figure 4:
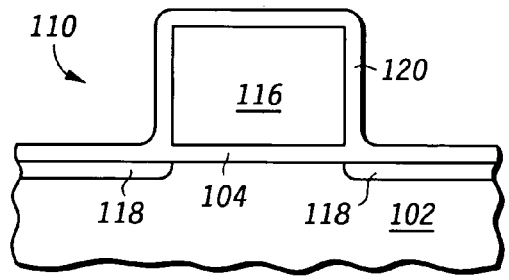
FIG. 4 illustrates processing subsequent to FIG. 3 in which a dielectric is formed over the substrate and the gate electrode.

Referring now to FIG. 4, an extension dielectric film 120 is formed over gate electrode 116. In one embodiment, dielectric film 120 is a low-K dielectric having a dielectric constant of less than approximately 4.0. In other embodiments, dielectric film 120 includes a film of chemically vapor deposited (CVD) silicon nitride. In this embodiment, the CVD silicon nitride is likely formed by reacting dichlorosilane or silane and ammonia in a reactor maintained at a temperature in the range of 300 to 800° C. A CVD silicon oxide pad layer may be deposited over gate electrode 116 prior to depositing the silicon nitride to alleviate stress that occurs when silicon nitride contacts silicon. The CVD dielectric film 120 is deposited in a substantially conformal manner such that the film thickness in vertical portions of the topography is roughly within at least 80% of the film thickness in horizontal portions of the topography.

Dielectric film 120 may be anisotropically etched or left as deposited. If dielectric film 120 is etched, the portions of the film adjacent the sidewalls of gate electrode 116 remain to provide isolation between gate electrode 116 and a subsequently deposited conductive extension structure. It is also desirable to leave a dielectric film over the portions of substrate 102 not covered by gate electrode 116 to isolate the conductive extension structure from substrate 102. If film 120 is etched, isolation from the substrate may be provided by the portions of gate dielectric 104 that remain after film 120 is etched. In addition, if film 120 includes silicon nitride over a silicon oxide pad layer, the etch of film 120 preferably removes the silicon nitride while leaving behind the silicon oxide.

One or more implant steps may be performed after forming dielectric film 120. In one embodiment, one or more extension implants are performed to introduce source drain extension regions 118 into those portions of substrate 102 not covered by gate electrode 116. The source/drain extension regions will be referred to as LDD regions 118 to avoid confusion with the conductive extension mentioned above and further described below. The LDD implant regions 118 are desirable to control the threshold voltage and effective channel-length of the resulting device. In an SOI embodiment of substrate 102, however, high dose ion implantation is undesirable because it is difficult to maintain the dose adequately within the very shallow silicon substrate. To address this problem, the LDD implants may be eliminated entirely from certain embodiments of the process in which case threshold voltage control is achieved by varying the doping polarity of one of the extensions (as described in more detail below).

Figure 5:
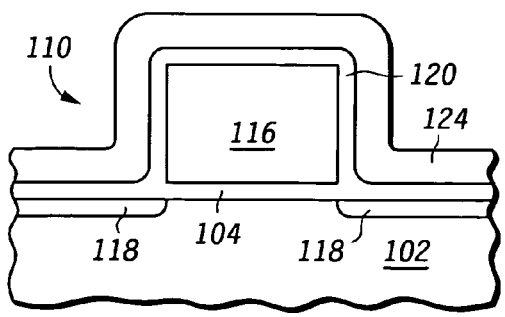
FIG. 5 illustrates processing subsequent to FIG. 4 in which a conductive film is formed over the dielectric film.

Referring now to FIG. 5, an electrically conductive extension spacer film 124 is deposited over dielectric film 120. In one embodiment, extension spacer film 124 is a CVD polysilicon formed in substantially the same manner as the polysilicon embodiment of gate electrode film 106 (see description of FIG. 2). In this embodiment, the polysilicon is deposited as an undoped film so that various portions of the film may subsequently be doped as desired. In other embodiments, extension spacer film 124 is an alternative conductive film such as silicon germanium or a tantalum or titanium based metal.

Figure 6:
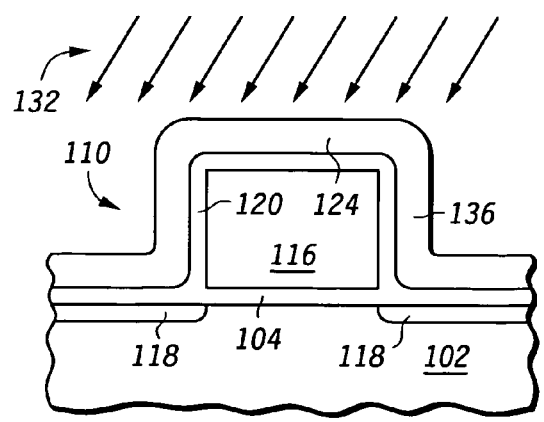
FIG. 6 illustrates processing subsequent to FIG. 5 in which a first portion of the conductive film is implanted with a first dopant.
Figure 7:
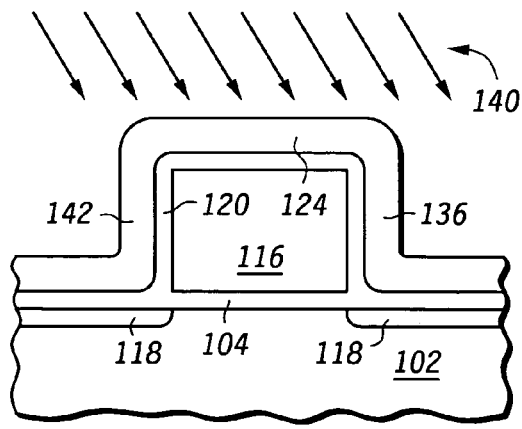
FIG. 7 illustrates processing subsequent to FIG. 6 in which a second portion of the conductive film is implanted with a second dopant.

Referring now to FIG. 6 and FIG. 7, first and second implants 132 and 140 are performed. First implant 132 is performed at a first implant angle typically between 6° to 60° to introduce a first dopant into conductive extension film 124. The implant angle used during first implant 132 causes the implant species to reside primarily in a portion 136 of conductive extension 124 "exposed" by the implant angle. By using an appropriate implant angle and orienting the transistors appropriately on wafer 100 (with respect to the wafer flat, for example), first implant 132 produces a first doping profile in first portion 136 of conductive extension film 124 where first portion 136 of extension film 124 represents the portion of film 124 on a first sidewall 112 of gate electrode 116.

Similarly, second implant 140 introduces a second doping profile primarily into a second portion 142 of extension film 124 by using a second implant angle. The second implant angle is likely the opposite of the first implant angle used during first implant 132. If, for example, the angle of first implant 132 is 10°, the angle of second implant 140 is likely −10°. In an embodiment suitable for controlling the threshold voltage and subthreshold leakage of the transistor, the polarities of the implant species used during first implant 132 and second implant 140 are opposite. Thus, first implant 132 may use a p-type species such as boron while second implant 140 uses an n-type species such as phosphorous or arsenic. In one particular embodiment suitable for fabricating n-channel transistors, for example, conductive gate 116 and second portion 142 of extension film 124 are n-doped while first portion 136 of extension film 124 is p-doped. In this embodiment, when the region under first portion 136 of film 124 is the used as the device's drain region, the resulting transistor will have an improved (elevated) Vt and a lower subthreshold leakage than a corresponding transistor in which the entire gate structure is doped with a uniform polarity.

The implant dosage of first and second implants 132 and 140 should be sufficient to achieve a highly doped first and second portion 136 and 142 of extension film 124 respectively. In an embodiment, in which first implant 132 is a p-type implant and second implant 140 is an n-type implant, a desirable dose for the implant is in excess of approximately $10^{13}$ ions/cm$^2$. The implant energy is desirably sufficient to achieve peak dose near the center of extension film 124. A representative implant energy for p-type (Boron) implants is in the range of approximately 10 to 100 keV while n-type (phosphorous) implants are in the range of approximately 30 to 100 keV. In other embodiments, additional or alternative implant techniques, such as plasma implantation and blocking layers (to fine tune an existing implant) may be used.

Figure 8:
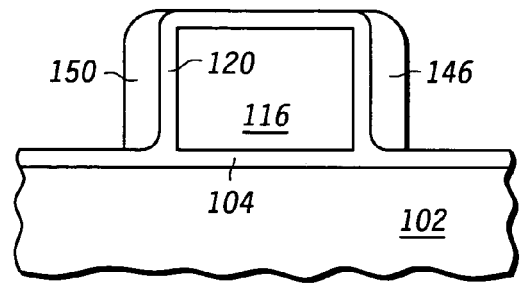
FIG. 8 illustrates processing subsequent to FIG. 7 in which the conductive film is patterned to form conductive extensions.

Turning now to FIG. 8, conductive extension film 124 of FIG. 7 has been anisotropically etched to produce first and second conductive extension spacer structures 146 and 150 respectively. As shown in FIG. 8, conductive extension spacers 146 and 150 are electrically isolated from gate electrode 116 and substrate 102 by dielectrics 120 and 104. In one embodiment, the lateral thickness of extension spacers 146 and 150 is approximately ¼ to ½ the lateral dimension (the L) of gate electrode 116. If, for example, gate electrode 116 is an L of approximately 100 nm, the lateral thickness of extension spacers 146 and 150 is in the range of approximately 25 to 50 nm together or individually. In other embodiments, the lateral dimensions of extension spacers 146 and 150 may be outside of this range.

Figure 9:
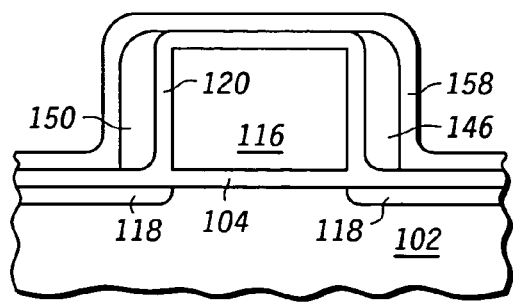
FIG. 9 illustrates processing subsequent to FIG. 8 in which a dielectric film is formed over the extensions and the gate electrode.
Figure 10:
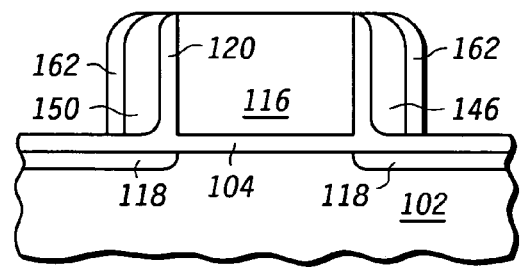
FIG. 10 illustrates processing subsequent to FIG. 9 in which the dielectric film is etched to form dielectric spacers.

Referring now to FIG. 9 and FIG. 10, a dielectric spacer film 158 is deposited and etched to form dielectric spacers 162 on the exterior sidewalls of extension spacers 146 and 150. Spacer film 158 may be a CVD silicon oxide, silicon nitride, or a combination of the two. Spacers structures 162 beneficially prevent shorting between source/drain regions and the gate electrode of the resulting transistor. More specifically, one embodiment of the process employs a silicide sequence to short extension spacers 146 and 150 to gate electrode 116. In this embodiment, spacer structures 162 prevent the silicide from shorting the source/drain regions to the extensions.

Figure 11:
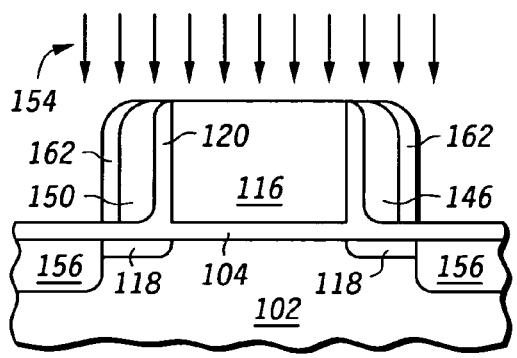
FIG. 11 illustrates processing subsequent to FIG. 10 in which source/drain regions of the substrate are implanted using the gate electrode, the extensions, and the dielectrics as an implant mask.

Referring now to FIG. 11, a source/drain implant 154 is performed to introduce a source/drain impurity distribution (region) 156 into substrate 102 using gate electrode 116, extensions spacers 146 and 150, and dielectric spacers 162 as an implant mask such that the source/drain regions 156 are self-aligned to spacers 162 and, because spacers 162 are preferably relatively thin and uniform, source/drain regions 156 are effectively self-aligned to extensions spacers 146 and 150. In another embodiment, implant 154 is performed prior to forming dielectric spacers 162 such that source/drain regions 156 are directly self-aligned to extensions spacers 146 and 150. In either embodiment, source/drain regions 156 are aligned to extension spacers 146 and 150. In an n-channel transistor embodiment, source/drain implant uses an n-type species such as phosphorous or arsenic while in a p-channel transistor embodiment, source/drain implant 154 uses boron or another p-type dopant. The impurity distribution 156 is preferably in excess of roughly $10^{19}$ atoms/cm$^3$.

Figure 12:
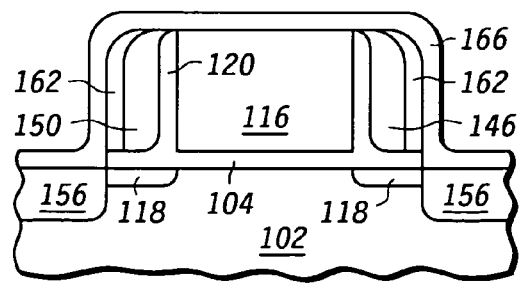
FIG. 12 illustrates processing subsequent to FIG. 11 in which a metal film is deposited over the wafer.
Figure 13:
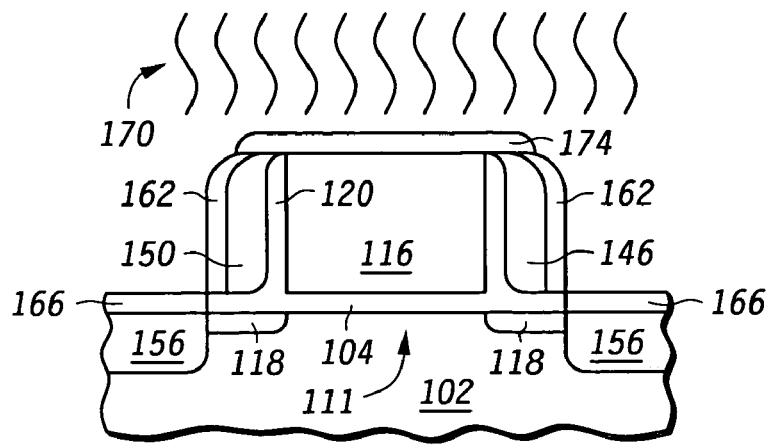
FIG. 13 illustrates processing subsequent to FIG. 12 in which the gate electrode and the extensions are tied together by a heat treatment of the silicide.

Referring now to FIG. 12 and FIG. 13, the extension spacers 146 and 150 are electrically connected to gate electrode 116 using a silicide process. In FIG. 12, a metal 166 such as cobalt is uniformly deposited over wafer 100. Prior to this deposition, the dielectric(s), including dielectric film 120, over source/drain regions 156 and any residual dielectric on an upper surface of gate electrode 116 are cleared to expose the doped semiconductor within substrate 102 and the polysilicon or other material of gate electrode 116. To the extent that the dielectrics to be cleared include silicon-oxide, an HF dip or other suitable wet process may be employed while silicon nitride and other dielectrics may require conventional dry etch processing.

After metal 166 is deposited, wafer 100 and metal 166 are exposed to a heated ambient 170 to form silicide wherever metal 166 contacts silicon (or other semiconductor). The portions of metal 166 in contact with a dielectric, such as spacers 162, remain unreacted after the heat step thereby enabling the unreacted portions to be selectively removed as shown in FIG. 13. This silicide process produces a conductive bridge 174 that electrically connects first and second extension spacers 146 and 150 to gate electrode 116. In addition to or in lieu of cobalt, metal 166 may include a material such as nickel, titanium, titanium nitride and combinations thereof.

The resulting transistor 110 as shown in FIG. 13 includes a three part biasing structure that includes gate electrode 116, and first and second conductive extension spacers 146 and 150, each of which is situated above and is isolated from an underlying substrate 102 by an intervening dielectric. Dielectric 120 intervenes between extension spacers 146 and 150 and the sidewalls of gate electrode 116. Source/drain regions 156 within the substrate reside on either side of a channel region 111 defined by the extension spacers 146 and 150. Voltages applied to the extension spacers 146 and 150, as well as gate electrode 116, modulate the conductivity of the channel region 111.

In the preferred embodiment, the polarities or doping types of the components of the biasing structure are independently variable. Thus, each of the three components of the biasing structures may be n-type or p-type or intrinsic. Because of work functions differences associated with different conductivity types, a common voltage applied to each of the three parts of the gate structure can have a different modulating effect on the underlying channel 111.

In one embodiment, the region 156 under first extension spacer 146 is used as the transistor's drain. In this embodiment, first extension spacer 146 is doped p-type while gate electrode 116 and second extension spacer 150 are both doped n-type. This configuration beneficially produces an energy band gap peak near the drain that effectively raises the transistor's threshold voltage and reduces short channel effects including the subthreshold leakage and DIBL (drain induced barrier leakage).

Figure 14:
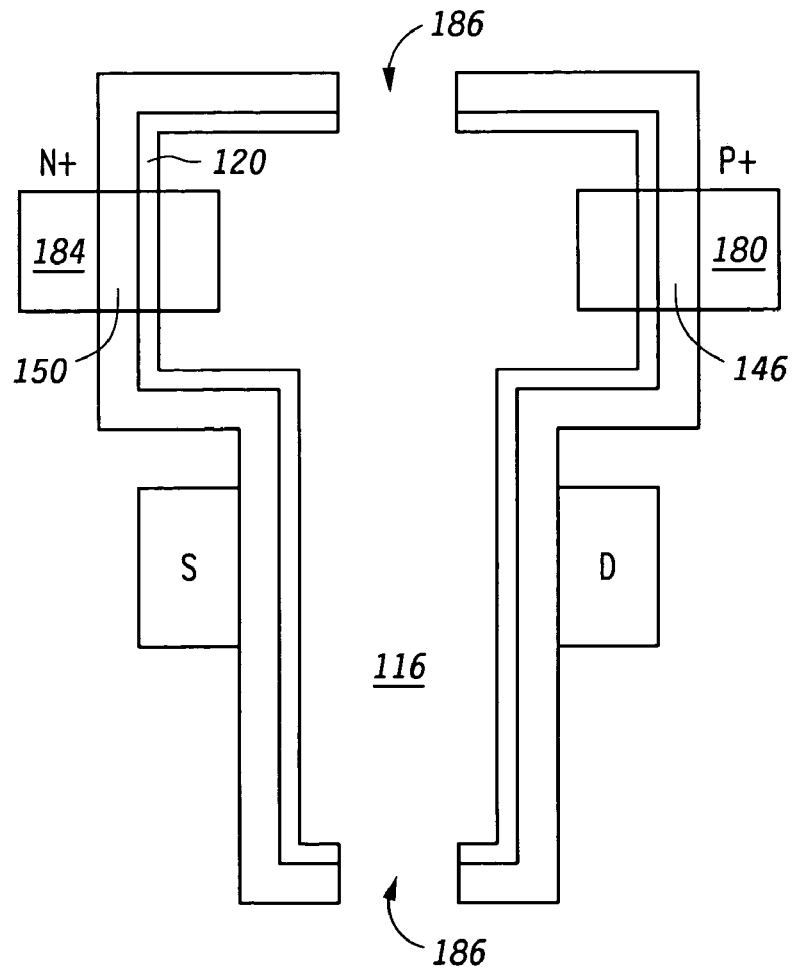
FIG. 14 is a top view of an alternative method of connecting the extensions to the rest of the transistor.

Referring now to FIG. 14, an alternative means for contacting and biasing extension spacers 146 and 150 is depicted. Instead of bridging extension spacers 146 and 150 to gate electrode 116 using a silicide process as described above with respect to FIG. 12 and FIG. 13, contacts 180 and 184 are used to tie extension spacers 146 and 150, respectively, to p+ and n+ portions of substrate 102 respectively. In this embodiment, a non-critical mask and etch sequence is used to form voids 186 that "split" the extension structure into two electrically isolated portions. This embodiment enables independent biasing of the components of the transistor's biasing structure, which may be beneficial in controlling threshold voltages in particular applications.

Thus it will apparent to those skilled in the art having the benefit of this disclosure that there has been provided, in accordance with the invention, a process for fabricating a an integrated circuit that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

What is claimed is:

1. A transistor in an integrated circuit, comprising:
   a gate electrode over a gate dielectric over a substrate;
   first and second electrically conductive extension spacers... respective gate electrode sidewall, wherein at least one of said first extension spacer and second extension spacer has a first conductivity type and at least one has a second conductivity type; and
   source/drain impurity regions in the substrate aligned to the extension spacers to define a channel region under the gate electrode and the first and second extension spacers.

2. The transistor of claim 1, wherein the first extension spacer and the gate electrode have a first conductivity type and the second electrode has a second conductivity type that differs from the first conductivity type.

3. The transistor of claim 2, wherein the first extension spacer and the gate electrode are n-type, the second extension spacer is p-type, and the source/drain regions are n-type.

4. The transistor of claim 3, wherein the source/drain region proximal to the second extension spacer is further characterized as the drain region.

5. The transistor of claim 1, further comprising a conductive silicide bridging the first extension gate, the gate electrode, and the second electrode.

6. The transistor of claim 1, wherein the first extension spacer electrically contacts an n+ portion of the substrate and the second extension spacer contacts a p+ portion of the substrate therein enabling independent biasing of the first and second extension spacers.

7. A transistor, comprising:
   a gate electrode overlying a gate dielectric overlying a semiconductor substrate;
   electrically conductive first and second extension spacers adjacent respective first and second sidewalls of the gate electrode including a dielectric intermediate between each of the extension spacers and its respective gate electrode sidewall;
   wherein the first extension spacer are doped with a first species and the second extension spacer are doped with a second species, wherein the polarities of the first and second extensions spacers are opposite; and
   source/drain regions in the substrate aligned to the extension spacers.

8. The transistor of claim 7, further comprising a silicide electrically bridging the gate electrode to the first and second conductive extensions.

9. The transistor of claim 7, further wherein the first extension spacer electrically contacts a first portion of the substrate and the second extension spacer electrically contacts a second portion of the substrate therein enabling independent biasing of the first and second extension spacers.

10. The transistor of claim 7, further comprising an extension implant region self-aligned to the gate electrode.

11. The transistor of claim 7, wherein the first extension spacer includes a first dopant implanted while maintaining the substrate at an implant angle in the range of 6° to 60° and wherein the second extension spacer includes a second dopant implanted while maintaining the substrate at an implant angle in the range of −6° to −60°.

12. The transistor of claim 7, wherein the extension spacers include an electrically conductive extension spacer.

13. The transistor of claim 7, wherein the gate electrode is an n-type gate electrode, the first extension spacer is an n-type extension spacer; and the second extension spacer is a p-type extension spacer.

14. An integrated circuit, comprising:
   first and second electrically conductive extension spacers adjacent respective sidewalls of a gate electrode overlying a semiconductor substrate, the gate electrode having a first type of conductivity;
   wherein the first electrically conductive spacer is doped with an impurity of the first conductivity type and the second electrically conductive spacer with an impurity of a second conductivity type;
   source/drain regions formed in the substrate laterally aligned to the first and second extension spacers, the source/drain regions defining a channel region between them wherein the channel region is modulated by a voltage applied to the gate electrode, the first extension spacer, or the second extension spacer.

15. The integrated circuit of claim 14, wherein the gate electrode, first extension spacer, and second extension spacer comprise polysilicon.

16. The integrated circuit of claim 14, wherein the first extension spacer is formed by implanting an extension spacer film with a first implant performed using a first implant angle and wherein the second extension spacer comprises is formed implanting the extension spacer film with a second implant performed using a second implant angle.

17. The integrated circuit of claim 14, further comprising a conductive silicide bridging the first extension spacer, the gate electrode, and the second extension spacer.

18. The integrated circuit of claim 14, further comprising, electrically the first extension spacer electrically contacts a first portion of the substrate and the second extension spacer electrically contacts a second portion of the substrate therein enabling independent biasing of the extension spacers.

* * * * *

UNITED STATES PATENT AND TRADEMARK OFFICE
CERTIFICATE OF CORRECTION

| | | |
|---|---|---|
| PATENT NO. | : 7,109,550 B2 | Page 1 of 1 |
| APPLICATION NO. | : 11/036860 | |
| DATED | : September 19, 2006 | |
| INVENTOR(S) | : Leo Mathew et al. | |

It is certified that error appears in the above-identified patent and that said Letters Patent is hereby corrected as shown below:

In Column 7, Lines 30-34 Claim No. 1:

Change "first and second electrically conductive extension spacers... respective gate electrode sidewall, wherein at least one of said first extension spacer and second extension spacer has a first conductivity type and at least one has a second conductivity type;"

to --first and second electrically conductive extension spacers adjacent respective sidewalls of the gate electrode with an extension dielectric intermediate between each extension spacer and its respective gate electrode sidewall, wherein at least one of said gate electrode, first extension spacer, and second extension spacer has a first conductivity type and at least one has a second conductivity type;--.

Signed and Sealed this
Eleventh Day of October, 2011

David J. Kappos
*Director of the United States Patent and Trademark Office*